United States Patent
Hosini et al.

(10) Patent No.: US 9,654,085 B2
(45) Date of Patent: May 16, 2017

(54) INTELLIGENT GATE DRIVER FOR IGBT

(75) Inventors: Falah Hosini, Sundbyberg (SE);
Madhan Mohan, Tamil Nadu (IN);
Siva Nagi Reddy Pamulapati, Andra Pradesh (IN); Arnost Kopta, Zürich (CH); Munaf Rahimo, Uezwil (CH); Raffael Schnell, Seon (CH); Ulrich Schlapbach, Liebefeld (CH)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 14/358,103

(22) PCT Filed: Nov. 22, 2011

(86) PCT No.: PCT/EP2011/070696
§ 371 (c)(1),
(2), (4) Date: May 27, 2014

(87) PCT Pub. No.: WO2013/075737
PCT Pub. Date: May 30, 2013

(65) Prior Publication Data
US 2014/0320178 A1 Oct. 30, 2014

(51) Int. Cl.
*H03K 3/00* (2006.01)
*H03K 3/012* (2006.01)
(Continued)

(52) U.S. Cl.
CPC ......... *H03K 3/012* (2013.01); *H03K 17/0828* (2013.01); *H03K 17/08128* (2013.01);
(Continued)

(58) Field of Classification Search
USPC ....................................................... 327/109
See application file for complete search history.

(56) References Cited

U.S. PATENT DOCUMENTS 6,496,047 B1 * 12/2002 Iskander et al. .............. 327/177
2006/0192589 A1 * 8/2006 Okazaki et al. .............. 326/112
(Continued)

FOREIGN PATENT DOCUMENTS

DE 10 2009 001 029 B4 12/2010
DE 102009030739 A1 * 12/2010
(Continued)

OTHER PUBLICATIONS

Rahimo et al., A Potential Technology for Higher Power Applications, IEEE, 2009.*

*Primary Examiner* — Lincoln Donovan
*Assistant Examiner* — Patrick Chen
(74) *Attorney, Agent, or Firm* — Birch, Stewart, Kolasch & Birch, LLP

(57) ABSTRACT

A reverse-conducting insulated gate bipolar transistor, particularly a bi-mode insulated gate transistor, is controlled by responding to an ON command by applying high-level gate voltage for a first period, during which a current is fed into a connection point, from which it flows either through the RC-IGBT or along a different path. Based hereon, it is determined whether the RC-IGBT conducts in its forward/IGBT or reverse/diode mode, and the RC-IGBT is either driven at high or low gate voltage. Subsequent conduction mode changes may be monitored in the same way, and the gate voltage may be adjusted accordingly. A special turn-off procedure may be applied in response to an OFF command in cases where the RC-IGBT conducts in the reverse mode, wherein a high-level pulse is applied for a second period before the gate voltage goes down to turn-off level.

22 Claims, 3 Drawing Sheets

(51) Int. Cl.
  *H03K 17/0812*  (2006.01)
  *H03K 17/082*   (2006.01)
  *H03K 17/18*    (2006.01)
  *H03K 17/567*   (2006.01)

(52) U.S. Cl.
  CPC ........... *H03K 17/18* (2013.01); *H03K 17/567* (2013.01); *H03K 2217/0027* (2013.01); *H03K 2217/0036* (2013.01)

(56) References Cited

U.S. PATENT DOCUMENTS

| | | | |
|---|---|---|---|
| 2007/0200602 A1* | 8/2007 | Ishikawa et al. | 327/110 |
| 2009/0040796 A1* | 2/2009 | Lalithambika et al. | 363/21.17 |
| 2010/0073041 A1* | 3/2010 | Djenguerian et al. | 327/143 |
| 2010/0079192 A1* | 4/2010 | Strzalkowski | 327/419 |
| 2011/0063003 A1* | 3/2011 | Friedman et al. | 327/157 |
| 2013/0049843 A1* | 2/2013 | Jorge | H03K 17/168 |
| | | | 327/438 |

FOREIGN PATENT DOCUMENTS

| | | |
|---|---|---|
| WO | WO 2010/149431 A2 | 12/2010 |
| WO | WO 2010/149432 A2 | 12/2010 |

* cited by examiner

410: Start

412: ON command has been received?

414: Wait for a first time period

416: RC-IGBT in forward or reverse mode?

418: Maintain high-level gate voltage

420: Maintain low-level gate voltage

422: Either conduction mode has changed or an OFF command has been received?

424: Either conduction mode has changed or an OFF command has been received?

426: Turn-off procedure for forward mode

428: Turn-off procedure for reverse mode

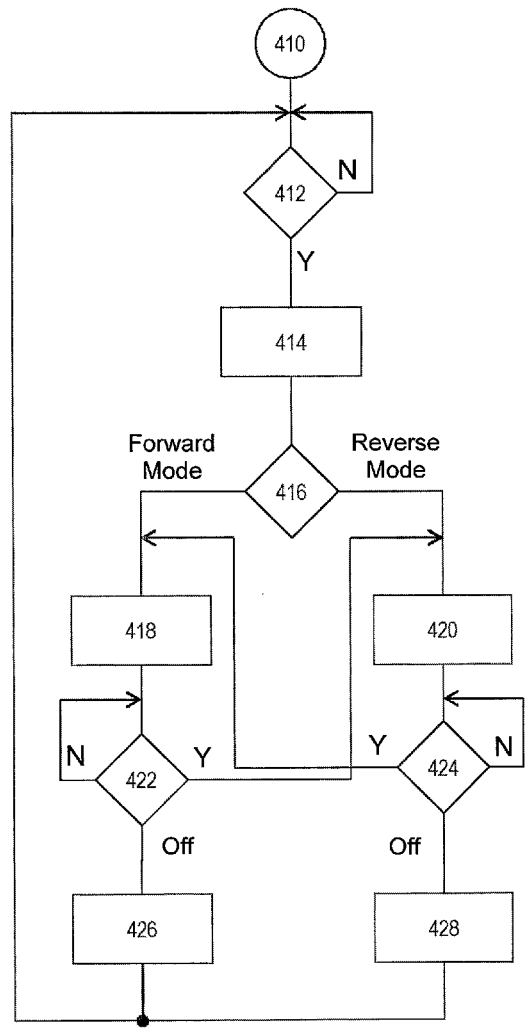

Fig. 4

INTELLIGENT GATE DRIVER FOR IGBT

FIELD OF THE INVENTION

The invention disclosed herein relates to power semiconductor devices. More precisely, it relates to a gate controller for a reverse-conducting insulated gate bipolar transistor (RC-IGBT), in particular a bi-mode insulated gate transistor (BIGT), as well as a method for driving such RC-IGBT.

BACKGROUND OF THE INVENTION

IGBTs are widely used in high-power switching equipment, such as high-voltage DC (HVDC) equipment, including voltage source converters. In such applications, an IGBT is typically combined with a diode arranged in parallel and conducting in the reverse transistor direction ("free wheel diode").

RC-IGBTs are chips in which a transistor is combined with a diode conducting in the reverse transistor direction. Numerous chip designs have been proposed and used within this concept, which has also been further developed relatively recently into the BIGT (see M. Rahimo et al., "Realization of high output power capability with the bi-mode insulated gate transistor (BIGT)", $13^{th}$ European Conference on Power Electronics and Applications, EPE '09, (8-10 Sep. 2009)). As used herein, the term RC-IGBT covers both conventional RC-IGBTs and BIGTs. A particular advantage of BIGTs over other RC-IGBT designs is their soft turn-off behaviour in both transistor and diode mode. It also appears possible to reduce the reverse recovery losses in BIGTs further than in earlier RC-IGBT technology.

Aspects of the gate-emitter voltage control in RC-IGBTs are discussed in WO 2010/149431 and WO 2010/149432. These documents describe a gate-emitter voltage controller adapted for a mode-dependent response to an ON command. In practice, the controller responds differently depending on the value of a voltage derived from the collector-emitter voltage and indicating whether the device is conducting in the forward or reverse mode. A voltage divider, which may include one or more high-voltage diodes, a Zener diode and/or a voltage source in addition to high-voltage resistors, provides this indication voltage as a constant fraction of the collector-emitter voltage. It is only in the forward conduction mode that the controller turns the transistor on in response to said ON command. According to WO 2010/149431, the turn-on gate voltage is released if the controller detects that the current has changed its direction or if it receives an OFF command.

A further article by Rahimo et al., "A high current 3300 V module employing reverse conducting IGBTs setting a new benchmark in output power capability", Proceedings of the $20^{th}$ International Symposium on Power Semiconductor Devices & ICs (18-22 May 2008), describes a technique for controlling an RC-IGBT in its reverse conducting mode. During conduction in the diode mode, the gate-emitter voltage is kept negative to store charge in the device and achieve a low forward voltage drop. When the diode is about to be turned off through turn-on of the opposite IGBT, a short positive gate-emitter voltage pulse is applied to the conducting diode to minimize the stored charge. A timing of the pulse that minimizes the reverse recovery charge and current may be chosen.

SUMMARY OF THE INVENTION

It is an object of the present invention to control the gate-emitter voltage of an RC-IGBT in such manner that the overall energy efficiency in a switching cycle is improved. It is a particular object to improve the control of an RC-IGBT arranged in an H bridge or half bridge, such as in a voltage source converter.

Accordingly, the invention provides a control method and a device with the features of the independent claims. The dependent claims define advantageous embodiments.

In a first aspect, the control method is characterised in that an ON command causes an initial high-level gate voltage (or gate-emitter voltage) pulse lasting a limited, first time period. During the pulse, a small current is fed into a connection point, which is electrically connected to an emitter terminal of the RC-IGBT, on the one hand, via a unidirectional conducting element arranged in series with the RC-IGBT itself and, on the other, via a branch parallel to the RC-IGBT. Information regarding the actual current path may be derived from the potential arising at the connection point. From this, it may be determined whether the transistor is conducting in its forward (or IGBT) mode or in its reverse (or diode) mode. If the potential current is below a (signed) threshold, it is determined that the transistor conducts in its reverse mode. Then, the gate voltage is lowered to low-level gate voltage, so that the forward voltage drop over the component is reduced.

Several advantages are associated with the invention. Firstly, no dedicated voltage divider need be provided. Instead, an anti-saturation detection circuit of the type commonly arranged in connection with IGBTs has the electrical properties required to supply the necessary information for determining whether the RC-IGBT conducts in forward or reverse mode. Further, since the connection point potential is monitored only at the end of the first time period, transient currents are allowed to vanish. For the same reason, a sudden mode change can be detected with only negligible delay. More precisely, a hypothetical control algorithm that reads the polarity of the collector-emitter voltage at the moment an ON command is received and then suspends monitoring during an interval, in which transients are expected, will not capture a mode change during this interval, which may lead to a suboptimal control signals being supplied.

In one embodiment, a gate unit (or gate controller) is responsible for feeding the current into the connection point. This advantageously reduces the amount of dedicated hardware needed to practice the invention.

In one embodiment, a constant-current source is used for forcing the current into the connection point. It will then be easy to determine a likely conduction state of the RC-IGBT based on the connection point potential as sole input information. As an alternative, the constant-current source may be implemented as a constant voltage and a resistive element which is serially arranged.

The unidirectional conducting element referred to above may be one or more diodes or high-voltage diodes. The unidirectional conducting element is preferably oriented so that it allows current to flow from the emitter to the collector, that is, parallel to the reverse direction of the RC-IGBT.

Alternatively or additionally hereto, the emitter and/or collector terminal is/are maintained at constant potential. For example, the terminal(s) may be connected (via a diode) to ground potential. This will enable more reliable detection, since the connection point potential values become relatively more distinct.

The control method may further comprise a continued monitoring of the connection point potential. The low-level gate voltage is maintained as long as the monitored potential stays below the threshold potential. When this is no longer the case, it may be concluded that the collector current has changed direction so that the transistor must conduct in its forward direction if it is turned on. Then, high-level gate voltage is applied. As a first option, it may be monitored whether the potential rises above the same threshold potential as the one used in the basic embodiment. As a second option, it may be monitored whether the potential rises above a different threshold potential, which is separated from the basic one by a hysteresis. A suitable amount of hysteresis may lead to a more regular switching behaviour.

As a complement or alternative to the previous embodiment, where the connection point potential is monitored after the first time period, the low-level gate voltage may be maintained until an OFF command is received. Then, a high-level gate voltage pulse is applied in order to minimize the stored charge and reduce reverse recovery losses. The pulse lasts a limited, second time period. After the pulse, the device is turned off in the usual manner, e.g., by applying zero-level gate voltage or a negative turn-off gate voltage. This unites the benefits of driving the device at low gate voltage in diode mode with the reduced reverse recovery losses arising when the stored charge is extracted shortly before a conduction episode ends.

The low-level gate voltage may be about 10 to 50% of the gate threshold voltage. It is at present not fully known whether the conduction losses decrease with the gate voltage all the way to zero. On the other hand, it has been observed that use of a non-zero gate voltage may lead to a softer, faster and more economical switching behaviour. For example, if the RC-IGBT controlled has a gate threshold voltage of 5 V, then the low-level gate voltage applied in the reverse conduction mode may be the threshold voltage minus a margin to avoid inadvertent firing, such as about 1 or 2 V. Depending on component tolerances, the upper bound of the low-level gate voltage may be as high as 80%, such as 60% or 40% of the gate threshold voltage. On the other hand, to ensure fast switching, the lower bound should be at least 10%, such as 20% or preferably 30%, independently of the upper bound.

The first time period may be one or a couple of microseconds. The first time period may be varied depending on the type of RC-IGBT controlled. More precisely, the first time period need not be as long as the duration of a full turn-on of the transistor, which would allow the collector current to develop into its steady-state value. Indeed, the first time period need only be so long that a current flows with sufficient magnitude that its direction can be determined. An incentive to shorten the first time period is to reduce losses in cases where the RC-IGBT is found to conduct in its reverse mode. The length of the first time period may also be chosen with the aim of allowing a major part of electric transients to vanish.

Preferably, if the control method is applied to the control of an RC-IGBT arranged in an H bridge or half bridge, the second time period is preferably shorter than the blanking time of the opposite transistor. In other words, the invention makes use of the fact that there is a dead time (or latency) between turn-off of one device and turn-on of the other device in series, irrespective of the conduction state. In other words, since no blanking time for turn-off is actually needed in the diode mode and hence the OFF command need not be obeyed immediately, there is sufficient time to apply high-level gate voltage for a second time period beginning at the time of receipt of the OFF command, provided the second time period does not extend beyond the blanking time. On the other hand, the second time period is preferably so long that the stored charge is allowed enough time to clear efficiently.

The above teachings may equally well be used for controlling a BIGT. Any adaptations necessary for making an RC-IGBT-oriented control method or device suitable for controlling a BIGT are believed to fall within the abilities of one of ordinary skill in the art.

The invention may be embodied as computer-readable instructions for controlling a programmable computer in such manner that it performs the control method outlined above. Such instructions may be distributed in the form of a computer-program product comprising a computer-readable medium storing the instructions. In particular, the instructions may be loaded in a FPGA or a microcontroller in a gate unit responsible for supplying the gate-emitter voltage.

Further objectives of, features of and advantages with the present invention will become apparent when studying the following detailed disclosure, the drawings and the appended claims. Those skilled in the art realize that different features of the present invention, even if recited in different claims, can be combined in embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which:

FIG. 4 is a flowchart of a control method according to an embodiment of the invention.

All the figures are schematic and generally only show parts which are necessary in order to elucidate the invention, whereas other parts may be omitted or merely suggested.

DETAILED DESCRIPTION OF EMBODIMENTS

Figure 1:
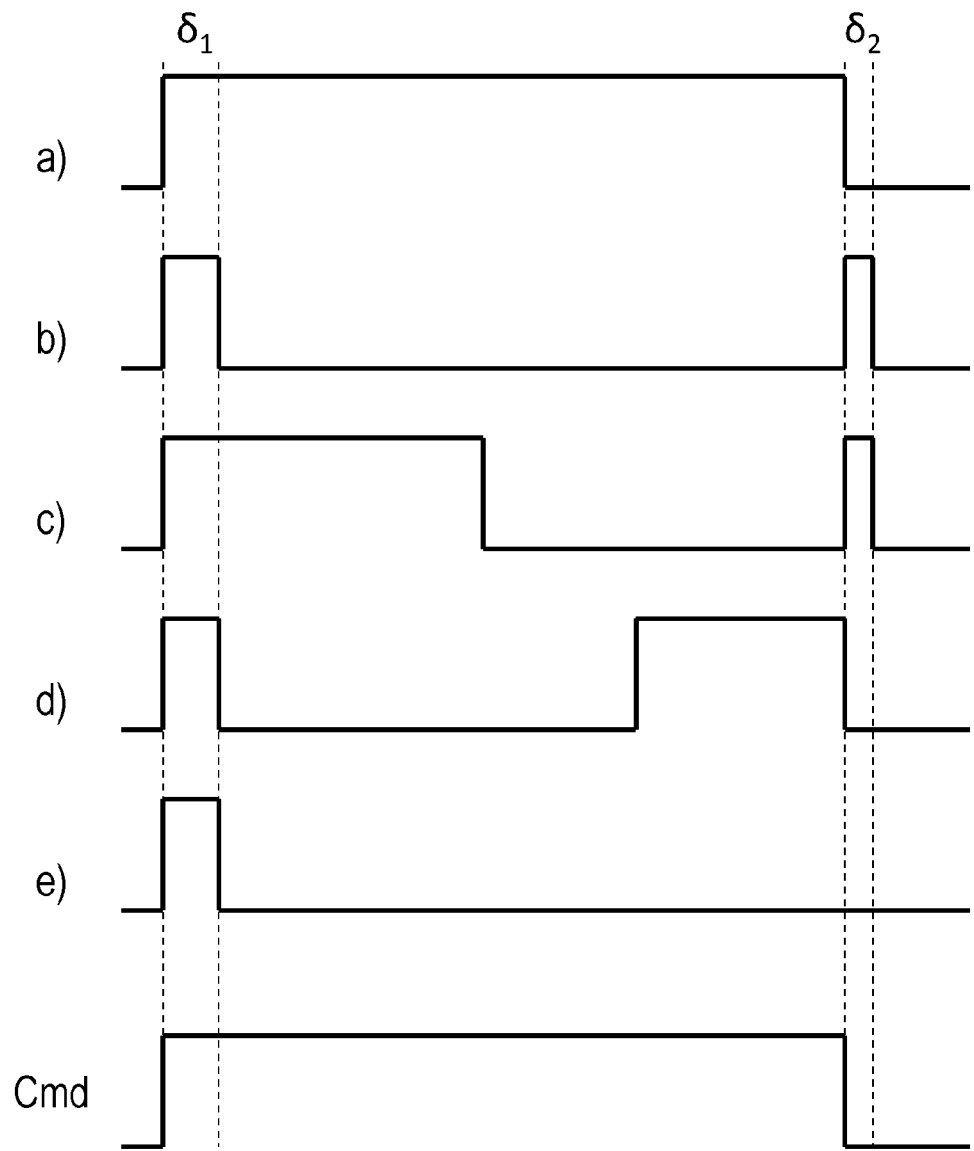
FIG. 1 graphically illustrates the behaviour over time of a gate signal applied to the a RC-IGBT which is controlled in accordance with an embodiment of the present invention.

FIG. 1 shows, as a function of time, a command signal Cmd provided to a an RC-IGBT gate controller according to the invention. The command signal transitions, at the beginning of a first time period $\delta_1$, from a low level (corresponding to a desired OFF state of the controlled device) to a high level (corresponding to a desired ON state of the controlled device) and then transitions, at the beginning of a second time period $\delta_2$, back from said high level to the low level. It is recalled that the figure has not been drawn to scale, but the time periods may, as shown, have different duration. FIG. 1 further shows the response of the gate controller to the command signal in five different operational scenarios, as outlined in Table 1.

TABLE 1

| a | RC-IGBT is in forward mode |
|---|---|
| b | RC-IGBT is in reverse mode |
| c | RC-IGBT is initially in forward mode, then in reverse mode |
| d | RC-IGBT is initially in reverse mode, then in forward mode |
| e | RC-IGBT is in short-circuit/over-current state and is turned off |

As will be described in more detail below, the ON command always triggers high-level gate voltage during the first time period $\delta_1$. The gate voltage to be applied after the first time period is dependent on the detected conduction state of the RC-IGBT. The turn-off procedure triggered by the OFF command is also dependent on the conduction mode, wherein reverse-mode conduction is preferably interrupted by a high-level voltage pulse during a second time period $\delta_2$. The pulse may be followed by zero-level gate voltage, preferably preceded by a pulse of turn-off-level gate voltage. For illustrative purposes, the high level may correspond to 15 V; the low level may be zero or near-zero voltage, such as about 1-2 V; the zero level may be 0 V; and the turn-off level may be a negative voltage of the order of a few volts, such as −5 V.

Figure 2:
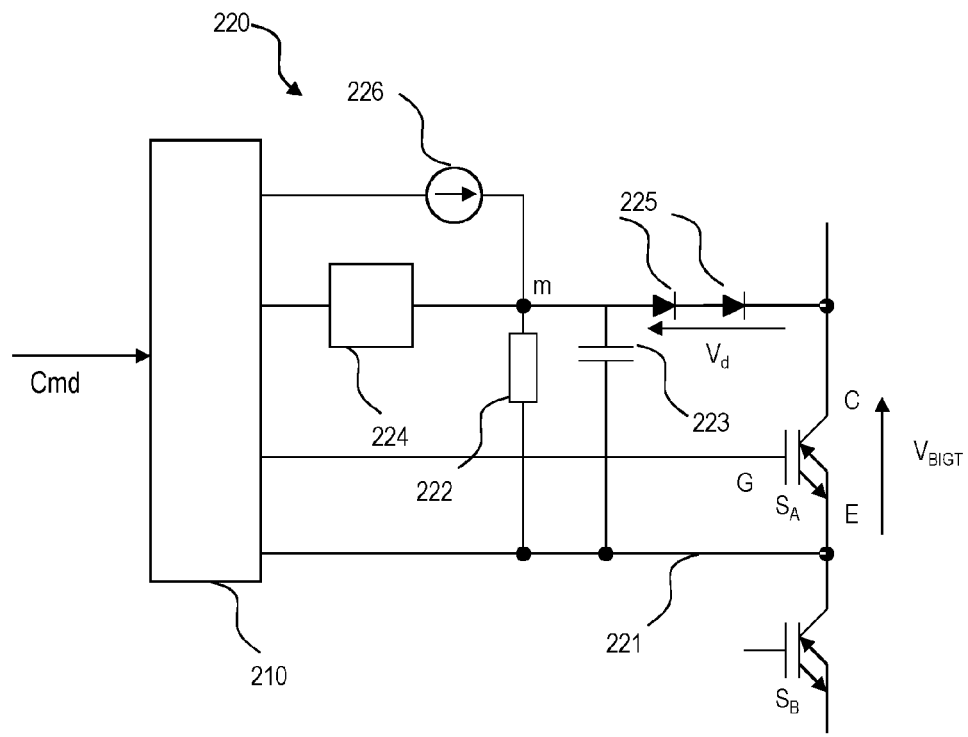
FIGS. 2 and 3 show two possible detection circuits for determining a conduction state of the RC-IGBT.
Figure 3:
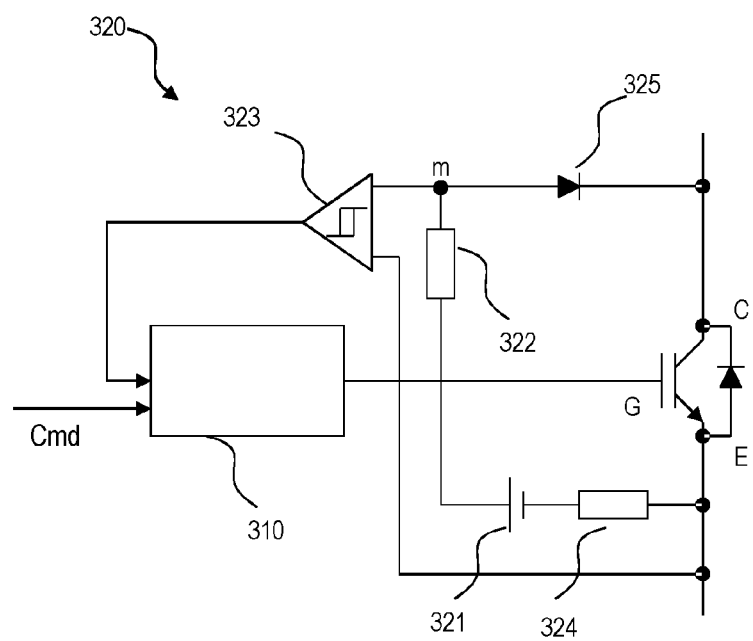

With reference to FIGS. 2 and 3, there will now be described two detection circuits for determining whether a connected RC-IGBT conducts in forward or reverse mode.

FIG. 2 is a circuit diagram of a portion of a half bridge in a voltage source converter, in which two BIGTs labelled $S_A$, $S_B$ are arranged in series between a positive and a negative current rail (not shown) of a direct current source (not shown). The output phase to be supplied to the load (not shown) is to be connected between the BIGTs $S_A$, $S_B$. For the sake of simplicity, the gate terminal of the lower BIGT $S_B$ has been merely suggested. To the gate terminal G of the upper BIGT $S_A$, there is connected a gate controller (or gate unit) 210. A detection circuit 220 for aiding in controlling the upper BIGT $S_A$ comprises a connection line 221 extending from the emitter terminal E, branching into one ohmic connection 222 and a capacitive connection 223 arranged parallel to this, and then connecting to the collector terminal C via one or more high-voltage diodes 225 conducting in the emitter-to-collector direction. To the point m where the diodes 225, the ohmic 222 and capacitive 223 connections join, there is further connected a constant-current source 226. (As an alternative, the constant-current source may be replaced by a DC drive potential arranged behind a series resistance.) In the on state of the BIGT, wherein a current flows in the connection line 221, the potential $V_m$ at the joining point is detected by an anti-saturation detection circuit 224 of a type known per se in the art. Because $V_{BIGT}$ is positive if the BIGT is in forward mode and negative if it is in reverse mode, the relationship $V_m = V_d + V_{BIGT}$ allows the circuit 224 to make the conclusions set out in Table 2. In the table, $V_{sc}$ denotes a threshold value indicating a short-circuit or over-current condition, which is defined in the anti-saturation detection circuit 224.

TABLE 2

| | |
|---|---|
| $V_m < V_d$ | The device is assumed to be in reverse (diode) mode |
| $V_d < V_m < V_{sc}$ | The device is assumed to be in forward (IGBT) mode |
| $V_{sc} < V_m$ | The device is assumed to be in a short-circuit/over-current state (and is to be turned off) |

The detection circuit 220 is arranged to monitor the status of the device continuously during an on period and provide the information to the gate controller 210, allowing this to respond appropriately to any mode transition from forward to reverse mode or from reverse to forward mode.

FIG. 3 shows an alternative detection circuit 320 adapted to monitor the conduction state of a BIGT or more generally, as shown in the figure, an RC-IGBT. The gate terminal G of the RC-IGBT is connected to a gate controller 310 supplying the gate control signal in response to a command signal Cmd with account taken of a detection signal provided from an output terminal of the detection circuit 320. The collector C and emitter E terminals of the RC-IGBTs may for instance be connected between a current rail of a DC source (not shown) and an output phase (not shown). A Schmitt trigger 323 supplies the detection signal from the detection circuit 320. One input of the Schmitt trigger 323 is connected to the emitter potential. The other input to the trigger 323 is a branching point m connected both to the collector potential via a diode 325 and, via a series resistor 322, to the high-voltage side of a voltage source 321, whose low-voltage side connects to the emitter terminal E via a series resistor 324. The current path through the circuit will depend on the actual conduction state of the RC-IGBT. The ability to define two distinct threshold values makes a Schmitt trigger particularly suitable if hysteresis is desired.

As suggested by FIGS. 2 and 3, the invention can be implemented as an intelligent gate unit with logic that operates independently of the higher-level switching control, from which the ON and OFF commands to be executed emanate. The invention may in particular be implemented in a hardware-near manner, close to the semiconductor device to be controlled.

Finally, FIG. 4 is a flowchart illustrating a control algorithm in accordance with an embodiment of the invention. From a starting point 410, the algorithm detects, at point 412, whether an ON command has been received. If no command has been received (right branch), the detection continues. If it has (downward branch), high-level gate voltage is applied, at point 414, for the duration of a first time period. At point 416, it is then determined whether the RC-IGBT controlled conducts in its forward or reverse mode. If the RC-IGBT conducts in its forward mode (left branch), at point 418, high-level gate voltage is maintained. It is then monitored, at point 422, whether the conduction mode has changed and whether an OFF command has been received. If nothing of this has happened (left branch), the monitoring is pursued. If an OFF command has been received (downward branch), the algorithm proceeds to point 426 and executes a turn-off procedure adapted for the forward mode, as outlined above. If the conduction mode has changed into reverse mode (right branch), the algorithm takes the same action as if, at point 416, it had been determined that the RC-IGBT was conducting in the reverse mode during the first time period, namely, low-level gate voltage is applied, at point 420. After point 420, the algorithm monitors, at point 424, whether the conduction mode has changed (or changed again) and whether an OFF command has been received. If nothing of this has happened (right branch), the monitoring continues with no change in the gate signal. If the conduction mode has changed into forward mode (left branch), the algorithm proceeds to point 418, wherein high-level gate voltage is applied. If an OFF command has been received (downward branch), the control algorithm performs, at point 428, a turn-off procedure adapted for the reverse mode, namely by applying a short high-level pulse to clear away stored charge before conventional turn-off voltage is applied. After each turn-off procedure, whether for the forward mode (point 426) or the reverse mode (point 428), the algorithm goes back to monitor, at point 412, whether a new ON command has been received.

As outlined above, the control algorithm illustrated by FIG. 4 may be embodied as computer-executable instructions distributed and used in the form of a computer-program product including a computer-readable medium storing such instructions. By way of example, computer-readable media may comprise computer storage media and communication media. As is well known to a person skilled in the art, computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media typically embodies computer readable instructions, data structures, program modules or other data in a modulated data signal such as a carrier wave or other transport mechanism and includes any information delivery media.

The invention claimed is:

1. A method of controlling a reverse-conducting insulated gate bipolar transistor, RC-IGBT, the method comprising, upon receiving an ON command:
   always applying high-level gate voltage during a first time period, and feeding a current during the first time period into a connection point connected, via a unidirectional conducting element, to a collector terminal of the RC-IGBT and, via a series resistor, to an emitter terminal of the RC-IGBT;
   monitoring the connection point potential during the first time period; and
   applying low-level gate voltage whenever it is determined that said connection point potential is below a threshold potential at the end of the first time period.

2. The method of claim 1, wherein, in said step of applying, the current fed into the connection point is supplied by a gate unit.

3. The method of claim 2, wherein, in said step of applying, a regulated constant current is fed into the connection point.

4. The method of claim 2, further comprising:
   continuing to monitor the connection point potential while maintaining low-level gate voltage; and
   when the connection point potential exceeds the threshold potential, applying high-level gate voltage.

5. The method of claim 2, further comprising:
   continuing to monitor the connection point potential while maintaining low-level gate voltage; and
   when an OFF command is received, applying high-level gate voltage for a second time period.

6. The method of claim 1, wherein, in said step of applying, a regulated constant current is fed into the connection point.

7. The method of claim 6, further comprising:
   continuing to monitor the connection point potential while maintaining low-level gate voltage; and
   when the connection point potential exceeds the threshold potential, applying high-level gate voltage.

8. The method of claim 6, further comprising:
   continuing to monitor the connection point potential while maintaining low-level gate voltage; and
   when an OFF command is received, applying high-level gate voltage for a second time period.

9. The method of claim 1, further comprising:
   continuing to monitor the connection point potential while maintaining low-level gate voltage; and
   when the connection point potential exceeds the threshold potential, applying high-level gate voltage.

10. The method of claim 1, further comprising:
    continuing to monitor the connection point potential while maintaining low-level gate voltage; and
    when an OFF command is received, applying high-level gate voltage for a second time period.

11. The method of claim 10, wherein the RC-IGBT is connected to a further RC-IGBT via its collector or emitter terminal, wherein the second time period is less than a blanking time of said further RC-IGBT.

12. The method of claim 1, wherein the low-level gate voltage is in the range from 10 to 50% of the gate threshold voltage of the RC-IGBT.

13. The method of claim 1, wherein the first time period is between 1 and 10 microseconds.

14. The method of claim 1, wherein the RC-IGBT is a bi-mode insulated gate transistor, BIGT.

15. A non-transitory computer readable medium comprising computer-readable instructions for performing the method of claim 1.

16. The method of claim 1, wherein the threshold potential is a voltage between two terminals of the unidirectional conducting element.

17. A controller comprising:
    a drive circuit accepting ON and OFF commands and being electrically connected at its output side to a gate terminal of a reverse-conducting insulated gate bipolar transistor, RC-IGBT, which is operable to admit a collector-emitter current; and
    a detection circuit comprising a connection point connected, via a unidirectional conducting element, to a collector terminal of the RC-IGBT and, via a series resistor, to an emitter terminal of the RC-IGBT, said detection circuit being adapted to feed a current into said connection point and providing a detected value of the connection point potential to the drive circuit during a first time period,
    wherein the drive circuit is configured to respond to an ON command by always applying a high-level gate voltage during the first time period and, whenever the detected value of said potential is below a threshold potential at the end of the first time period, by subsequently applying low-level gate voltage.

18. The controller of claim 17, wherein the drive circuit is a gate unit.

19. A voltage source converter for converting between AC and DC current, comprising:
    at least one RC-IGBT; and
    a controller according to claim 18, the drive circuit of which is electrically connected to the gate terminal of the RC-IGBT.

20. The controller of claim 17, further comprising
    a constant-current source arranged to feed a regulated constant current into the connection point.

21. The controller of claim 17, wherein the drive circuit is configured to apply low-level gate voltage which is in the range from 10 to 50% of the gate threshold voltage of the RC-IGBT.

22. The controller of claim 17, wherein the threshold potential is a voltage between two terminals of the unidirectional conducting element.

* * * * *